(12) United States Patent
Yan et al.

(10) Patent No.: US 7,304,102 B2
(45) Date of Patent: *Dec. 4, 2007

(54) PROCESS FOR MAKING ENCAPSULANT FOR OPTO-ELECTRONIC DEVICES

(75) Inventors: Yongan Yan, Thousand Oaks, CA (US); Douglas Evan Meyers, Calabasas, CA (US); Mark Allen Morris, Calabasas, CA (US); D. Laurence Meixner, Camarillo, CA (US); Satyabrata Raychaudhuri, Thousand Oaks, CA (US)

(73) Assignee: Yazaki Corporation (JP)

( * ) Notice: Subject to any disclaimer, the term of this patent is extended or adjusted under 35 U.S.C. 154(b) by 391 days.

This patent is subject to a terminal disclaimer.

(21) Appl. No.: 11/007,766

(22) Filed: Dec. 7, 2004

(65) Prior Publication Data

US 2005/0101699 A1    May 12, 2005

Related U.S. Application Data

(62) Division of application No. 10/455,733, filed on Jun. 4, 2003, now Pat. No. 6,841,888.

(51) Int. Cl.
| | |
|---|---|
| *C08L 63/00* | (2006.01) |
| *B32B 27/04* | (2006.01) |
| *B32B 27/20* | (2006.01) |
| *B32B 27/38* | (2006.01) |
| *H01L 21/56* | (2006.01) |

(52) U.S. Cl. .................. 523/427; 523/440; 523/443; 523/444; 523/445; 523/466; 525/525; 428/413; 438/127

(58) Field of Classification Search ............... 428/413; 523/427, 440, 443, 444, 445, 457, 466; 525/523, 525/524, 525, 526, 529, 530, 532, 533; 438/127

See application file for complete search history.

(56) References Cited

U.S. PATENT DOCUMENTS

| 3,547,871 A | 12/1970 | Hoffman |
| 4,358,552 A | 11/1982 | Shinohara et al. |
| 5,175,199 A | 12/1992 | Asano et al. |
| 5,198,479 A | 3/1993 | Shiobara et al. |
| 5,618,872 A | 4/1997 | Pohl et al. |
| 5,818,404 A | 10/1998 | Lebby et al. |
| 6,246,123 B1 | 6/2001 | Landers, Jr. et al. |
| 6,587,573 B1 | 7/2003 | Stam et al. |
| 6,713,571 B2 | 3/2004 | Shimada |
| 2003/0138132 A1 | 7/2003 | Stam et al. |
| 2006/0083851 A1* | 4/2006 | Yan et al. .................. 427/96.2 |

FOREIGN PATENT DOCUMENTS

| EP | 0 391 447 B1 | | 11/1994 |
| JP | 60184561 | | 9/1985 |
| JP | 04-222855 A | | 8/1992 |
| JP | 06-065473 | * | 3/1994 |
| JP | 11-074424 | | 3/1999 |
| JP | 2002-080698 | * | 3/2002 |
| JP | 2002-105291 | | 4/2002 |
| JP | 2003-003043 | | 1/2003 |

OTHER PUBLICATIONS

Machine translation of JP 06-065473, provided by the JPO website.*
Machine translation of JP 2002-080698, provided by the JPO website.*

* cited by examiner

*Primary Examiner*—Michael J. Feely
(74) *Attorney, Agent, or Firm*—Sheppard, Mullin, Richter & Hampton LLP

(57) ABSTRACT

An encapsulant for use with opto-electronic devices and optical components incorporates a filler made from a glass that has been processed into particle form and heated to a predetermined temperature for a predetermined time, along with an epoxy having an index of refraction matched to that of the glass and heated to a predetermined temperature for a predetermined time, to prevent settling of the filler particles after mixing the filler particles with the epoxy, and thereby obtaining uniform dispersion of the particles within the epoxy. The encapsulant provides for high light transmittance, and its coefficient of thermal expansion can be varied by varying the amount of filler without substantially altering the optical properties of the encapsulant. The coefficient of thermal expansion variation within the encapsulant preferably is less than 30%, due to uniform dispersion of the filler particles within the epoxy.

33 Claims, 8 Drawing Sheets

SBE-100810 Encapsulant for optoelectronic devices – Figure 1
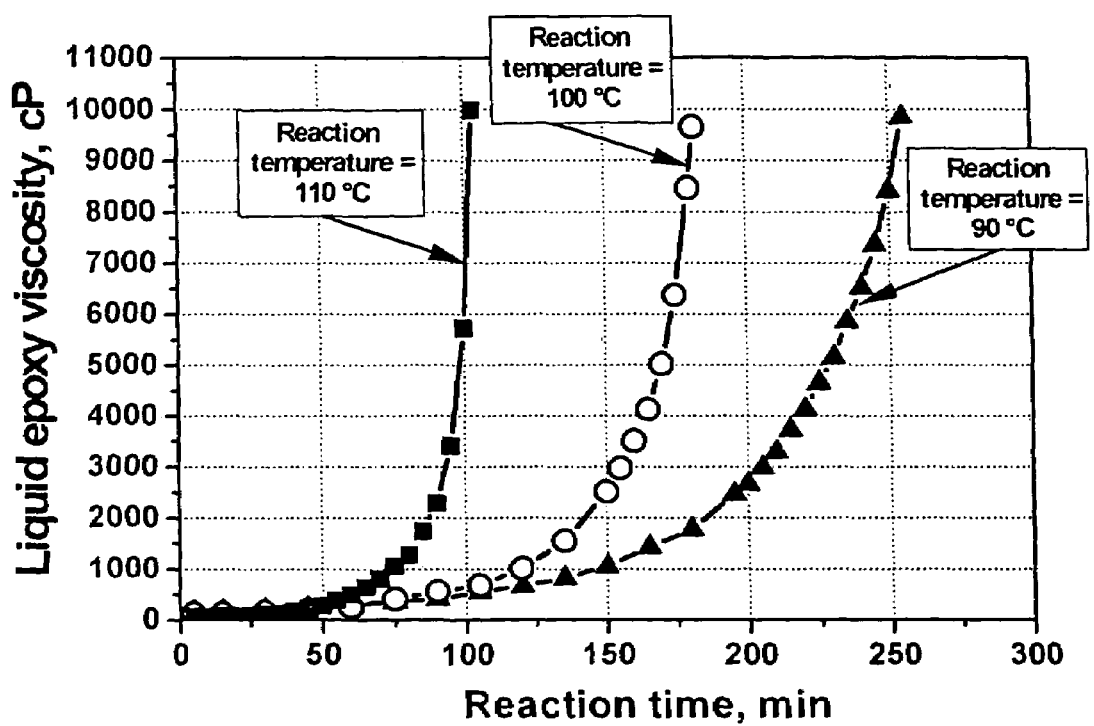

SBE-100810 Encapsulant for optoelectronic devices – Figure 2
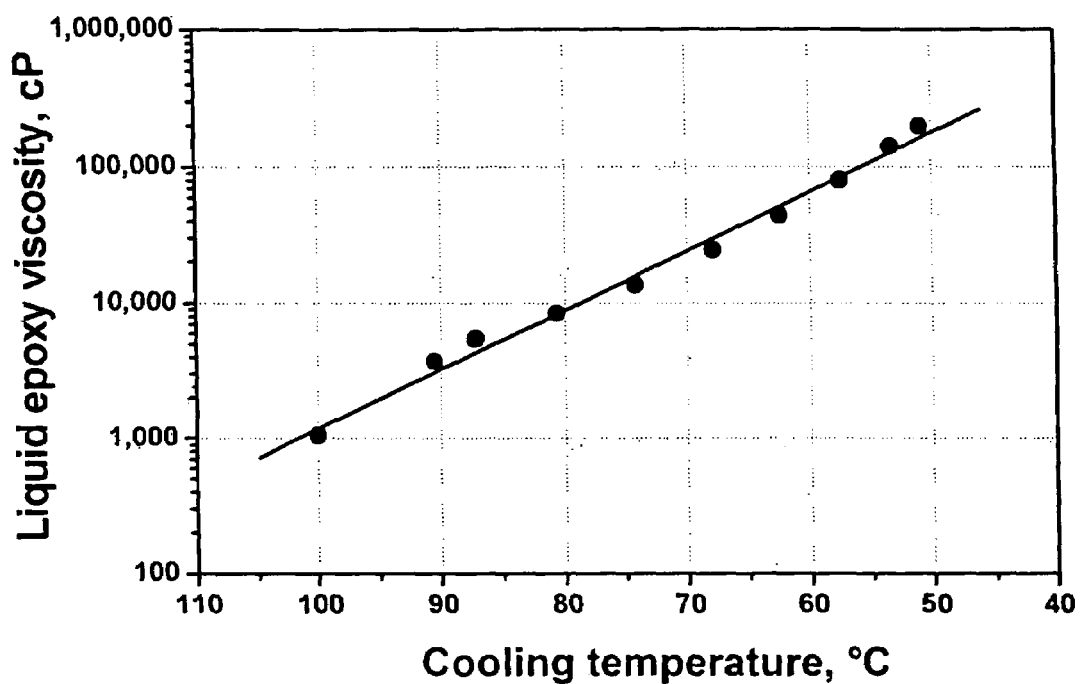

SBE-100810 Encapsulant for optoelectronic devices – Figure 3
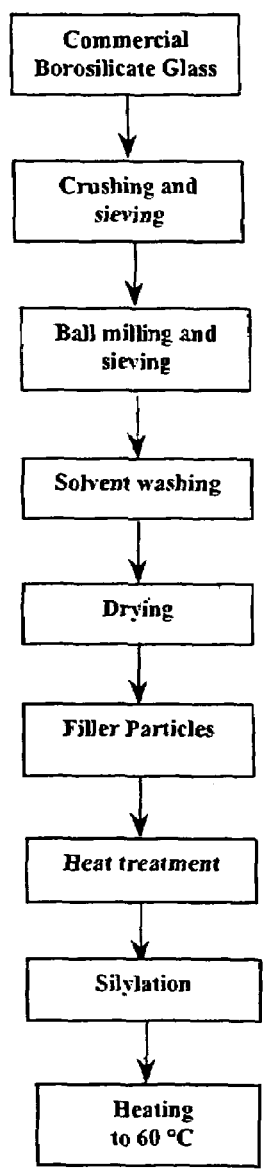

SBE-100810 Encapsulant for optoelectronic devices – Figure 4
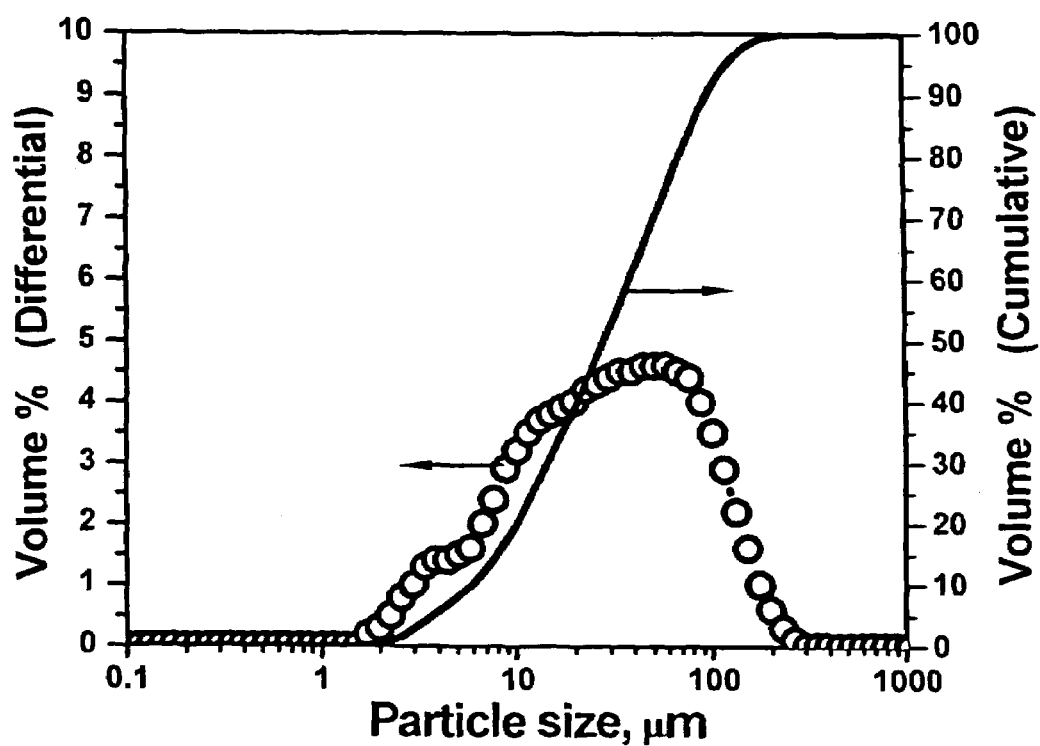

SBE-100810 Encapsulant for optoelectronic devices – Figure 5
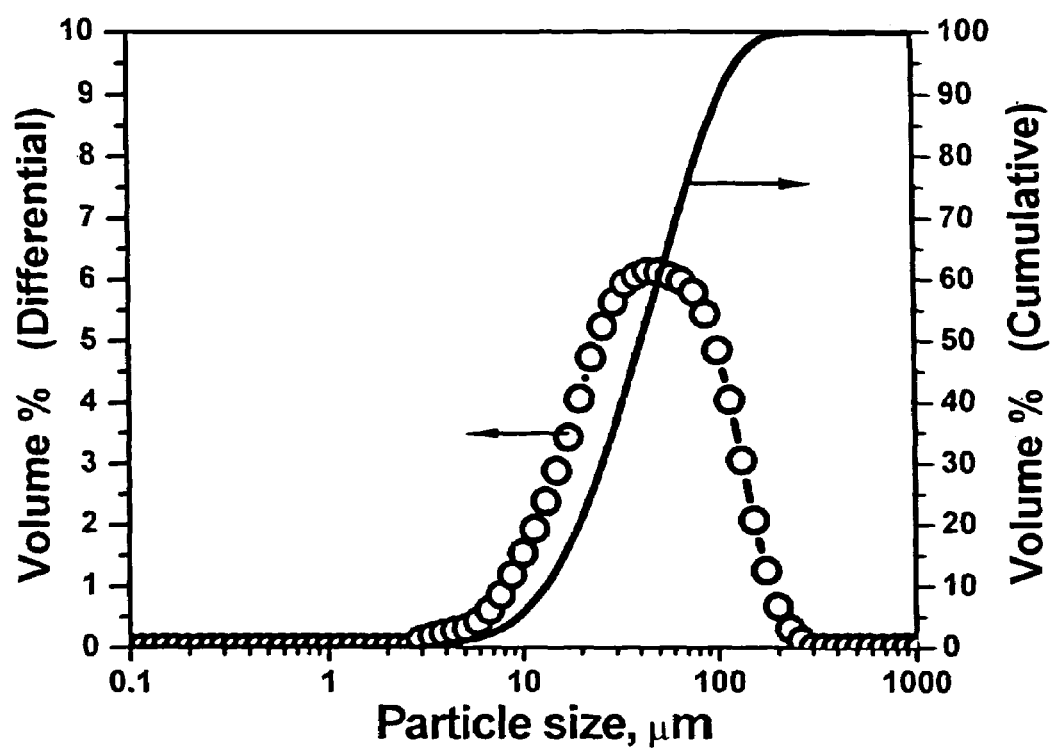

SBE-100810 Encapsulant for optoelectronic devices – Figure 6
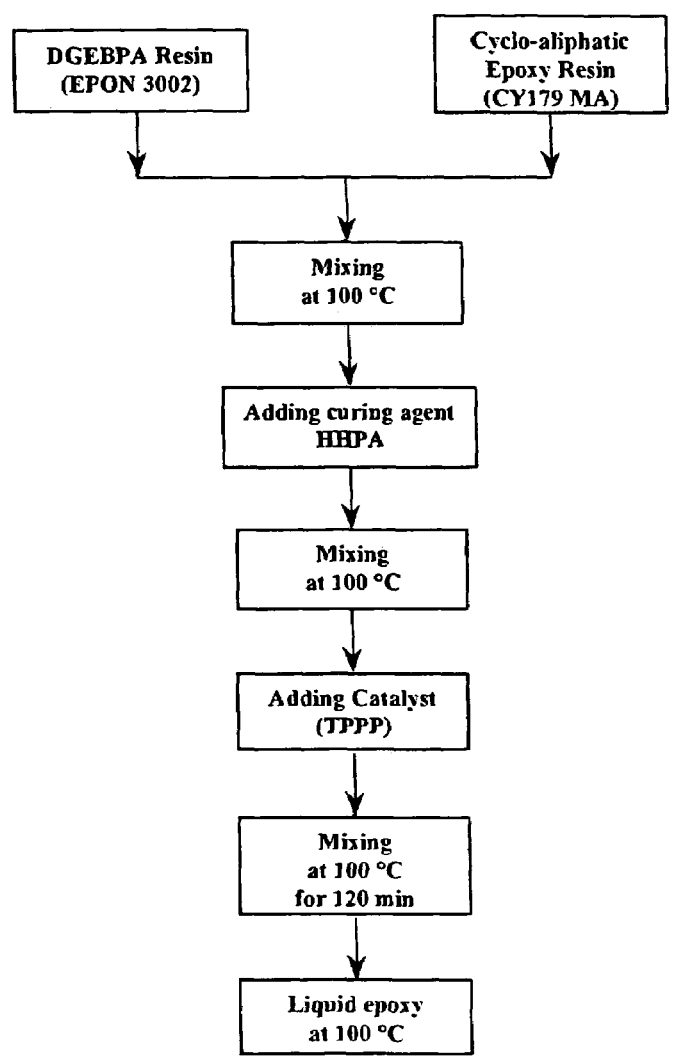

SBE-100810 Encapsulant for optoelectronic devices – Figure 7
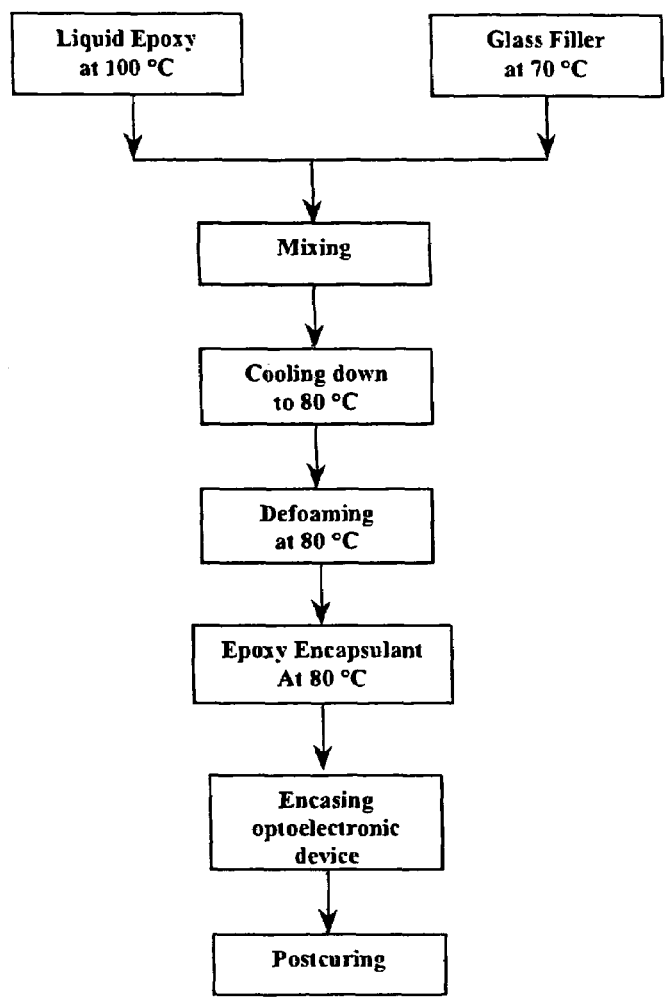

SBE-100810 Encapsulant for optoelectronic devices – Figure 8
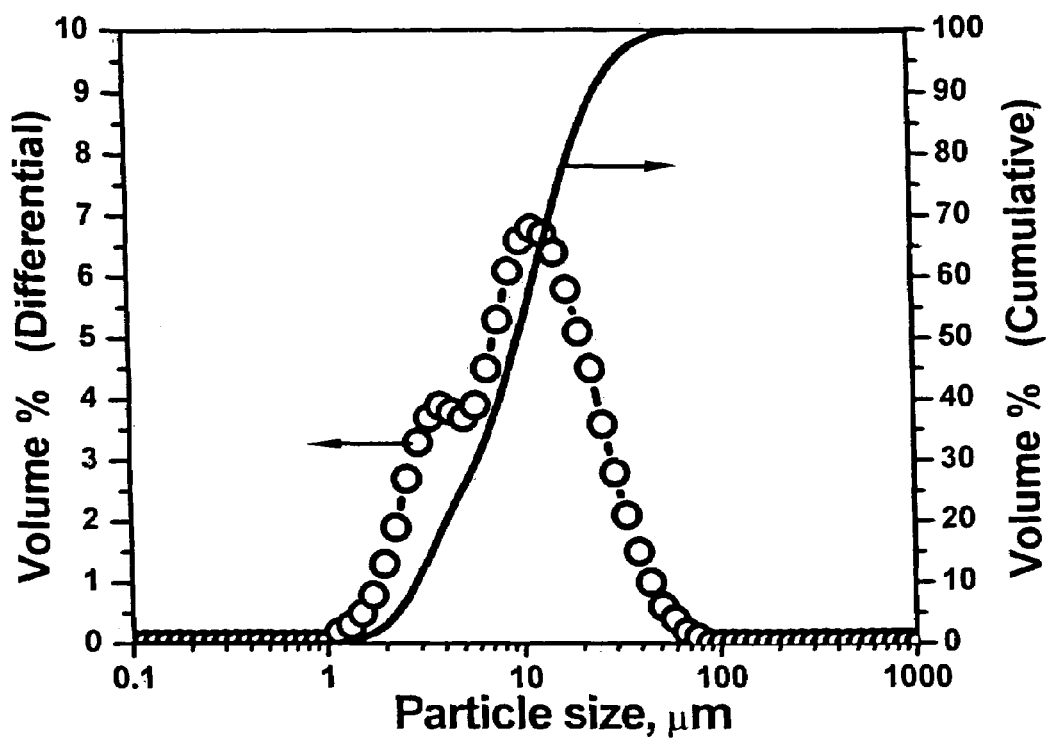

PROCESS FOR MAKING ENCAPSULANT FOR OPTO-ELECTRONIC DEVICES

This is a division of U.S. patent application Ser. No. 10/455,733, filed Jun. 4, 2003 now U.S. Pat. No. 6,841,888.

BACKGROUND OF THE INVENTION

The present invention relates generally to encapsulants for opto-electronic devices, and more particularly, to such encapsulants exhibiting superior optical qualities. The present invention also relates to methods for making such encapsulants.

Optical and electronic (i.e., "opto-electronic") devices, such as LEDs, photodetectors, and fiber optic components, generally are encapsulated using a variety of materials to protect the devices from vibration, humidity, heat, environmental deterioration, electrical leakages, and other deteriorative factors. A suitable encapsulant should possess a number of particular characteristics, described in detail below.

The encapsulant should have a coefficient of thermal expansion (CTE) preferably lower than 50 ppm/° C. Also, variation in the CTE should be lower than ±30% over the entire volume of the encapsulant. If the CTE and/or its variation are greater than these values, the encapsulant can excessively expand or contract when exposed to varying temperatures, thereby causing breakage of the device or its leads.

The encapsulant also should have the highest possible light transmittance, preferably at wavelengths between 300 nm and 800 nm. In particular, the encapsulant preferably should exhibit light transmittance higher than 65% at about 650 nm for an encapsulant having thickness of about 1 mm. In contrast, commercially available encapsulants often have substantially lower transmittance, and therefore are translucent, or even opaque. This can lead to difficulty when these encapsulants are used with opto-electronic devices requiring light transmission.

Additionally, the encapsulant should have a glass transition temperature ($T_g$) preferably higher than 120° C. Because opto-electronic devices are subjected to temperatures substantially higher than usual ambient temperatures, the encapsulant can flow when its glass transition temperature is exceeded, resulting in destruction of the encapsulated device.

The encapsulant also should have high electrical resistivity, to provide sufficient insulation for the opto-electronic devices. It should further provide adequate electrical insulation to protect the opto-electronic devices from the effects of adverse environmental conditions, such as heat and humidity. Finally, the encapsulant should be inexpensive and easy to produce using readily available materials.

Transparent epoxy resin compositions having refractive indices (i.e. $n_D$ at 25° C.) varying between 1.48 and 1.60 at a wavelength of about 588 nm can be prepared by curing commercially available chemical compounds incorporating epoxy groups. These inexpensive commercial epoxy resins also are known to exhibit high light transmittance, high $T_g$, high electrical resistivity, and high heat resistance. However, these epoxy resins usually have CTE higher than 50 ppm/° C., and therefore they are not suitable for use as encapsulants for opto-electronic devices.

Encapsulants having low CTE can be prepared by mixing commercially available uncured epoxy compounds with inorganic fillers, followed by curing of this mixture. For example, U.S. Pat. No. 3,547,871 to Hofman et al. describes a low CTE encapsulant comprising an epoxy resin and a filler having a particle size ranging between 10 μm and 300 μm. This encapsulant resin has a viscosity below 20,000 cP at 100° C. The filler is selected from silica, fused quartz, beryllium aluminum silicate, lithium aluminum silicate, or mixtures of these. The claimed encapsulants have a CTE lower than 50 ppm/° C. However, the Hofman '871 patent does not disclose an encapsulant having high light transmittance.

An encapsulant having both low CTE and high light transmittance can be prepared by incorporating a filler and epoxy having the characteristics described as follows. The filler should be uniformly dispersed in the epoxy to provide a uniform filler CTE over the entire volume of the encapsulant, to prevent eventual damage of the opto-electronic device from the cumulative effect of operation at varying temperatures. To obtain uniform particle dispersion and produce an encapsulant having a uniform CTE, the filler should have a predetermined and consistent particle size, and the liquid epoxy should have a predetermined viscosity. If the filler particle size is smaller than about 1 μm, the particles tend to agglomerate, resulting in non-uniform particle dispersions and entrapment of gas bubbles in the encapsulant. This results in lowered light transmittance of the encapsulant. Such agglomeration and bubble formation might be avoided by reducing the amount of the filler used in the encapsulant. However, reducing filler amount tends to increase the CTE of the encapsulant above 50 ppm/° C. Therefore, preferably agglomeration is avoided by using fillers having particle sizes greater than about 1 μm. Unfortunately, if filler particle size is larger than about 1 μm, the particles can settle at the bottom of the encapsulant during preparation and casting of the encapsulant due to gravity. This settling will occur if epoxy viscosity is too low during preparation of the encapsulant layer, leading to non-uniform distribution and non-uniform CTE in the encapsulant. Conversely, if epoxy viscosity is too high, forming the encapsulant layer over the opto-electronic device can be difficult. Therefore, the viscosity of the liquid epoxy should be within a specified range in order for the material to be useful in preparation of the encapsulant.

In addition to uniform dispersion, the refractive index of the filler should closely match the refractive index of the epoxy resin at the cured stage to have high light transmittance. Inorganic fillers frequently are used to lower costs or enhance mechanical properties of the resins. However, their use also can lead to decreased optical transmittance and scattering of light by the medium produced. This scattering can be decreased, and the optical transmittance of the medium can be increased, by closely matching the refractive index of a transparent filler used with that of a transparent resin. Because the refractive index of these filler particles generally cannot be directly measured with sufficient precision, this matching generally must be performed by trial and error, adjusting the filler or epoxy as needed.

Also, the filler should be free of chemical compounds that can reduce the electrical resistivity of the encapsulant below an acceptable level under the temperature and humidity conditions of the device. Some of these compounds have inherently low electrical resistivity, while others can decompose into or form electrically conductive ions. Heat and humidity can affect this inherent electrical resistivity or this decomposition, as well as migration of the ions. Therefore, preparation of the filler from such compounds should be avoided. Finally, the filler should be manufactured easily and inexpensively.

Single-component particles of inorganic metal oxides, such as $SiO_2$, $TiO_2$, and $ZrO_2$, are known to be easily and inexpensively prepared using vapor deposition or solution precipitation processes. These particles can be used as fillers in encapsulants. However, these particles are often less than 1 µm in size, and therefore generally are unsuitable for use as fillers for the reasons described above. Furthermore, most single-component particles cannot be used as fillers, because they have fixed refractive indices. For example, $SiO_2$ particles have a fixed refractive index of 1.42, $TiO_2$ (rutile form) of 2.3, and $ZrO_2$ of 1.95. These indices cannot be adjusted to match the refractive index of the, epoxy resin used for making the encapsulant.

It is possible to adjust the refractive index of fillers made from multi-component glass particles. For example, U.S. Pat. No. 5,175,199 to Asano et al. describes a sol-gel method for making a multi-component glass filler to be mixed into a transparent epoxy, which can be used as an encapsulant for optical semiconductor devices. In this method, $TiO_2$—$SiO_2$ gel is synthesized by hydrolyzing and condensing a silicon alkoxide and a titanium alkoxide. This gel is dried, and then either ground into particulate matter, followed by sintering to dense glass beads, or sintered into a dense glass followed by grinding into glass beads. This sintering is achieved at a very high temperature range of 1,050° C. to 1,250° C. The disclosed filler manufacturing method has the disadvantages of being complicated and expensive, as well as requiring lengthy preparation time and high sintering temperature. Therefore, production of these fillers is expensive. Additional disadvantages include possible phase separation, crystallization, and coloring of $TiO_2$ at the high sintering temperatures required using these methods. Phase separation and crystallization cause intolerably high refractive index differences between the glass filler and the epoxy, thereby lowering the transmittance. $TiO_2$ is also known to possibly cause yellowing of organic resins in which it is included as a result of extended exposure to light. This leads to degradation of the transmittance of the encapsulant over time.

U.S. Pat. No. 5,198,479 to Shiobara et al. uses the method described in the Asano '199 patent described above, and it further discloses a method to overcome the discoloration problems of the $TiO_2$—$SiO_2$ fillers discussed above, by addition of organic phosphorus anti-discoloring agents into the uncured epoxy-filler composition. This addition, while effective, further complicates use of the method described in the Asano '199 patent, and the resulting filler therefore is more expensive.

European Patent No. 0 391 447 B1 to Nakahara et al. teaches a sol-gel method for the production of multi-component metal oxide particles that can be used as fillers in transparent organic resins. The Nakahara et al. patent incorporates the step of first preparing seed particles of single-component metal oxides, then growing these particles by addition of hydrolyzable and condensable organic metal compounds such as metal alkoxides, to prepare multi-component particles such as $TiO_2$—$SiO_2$, $ZrO_2$—$SiO_2$, and $Al_2O_3$—$SiO_2$. This process is complicated and expensive, and the fillers produced are expensive. Furthermore, because these particles are smaller than 1 µm in size, it is difficult to obtain both homogeneous bubble-free dispersions of these particles in the epoxy and low CTE.

U.S. Pat. No. 5,618,872 to Pohl et al. discloses a method for making multi-component encapsulant filler particles for opto-electronic devices, comprising two or more oxides selected from $SiO_2$, $TiO_2$, $ZrO_2$, $Al_2O_3$, $V_2O_5$, and $Nb_2O_5$. The method for particle preparation described in this patent is similar to that described in the Nakahara et al. patent, and it shares the same drawbacks. Therefore, it is not suitable for preparation of high transmittance encapsulants.

Dunlap and Howe, in Polymer Composites, vol. 12(1), pp. 39-47, (1991), describe a casting composition comprising a resin and an index-matched filler prepared by ball milling of a glass. The size of the filler particles ranges between 2 µm and 100 µm. Subsequent to ball milling, the filler particles are annealed at temperatures between 0° C. and 10° C. above the glass strain point for at least one hour to remove stresses, as well as organic contaminants. The inventors have found that heat treatments at temperatures above the strain point of the glass can reduce transmittance, and therefore such temperatures should be avoided. Furthermore, Dunlap and Howe do not disclose an encapsulant having a uniform CTE and a method for preparing such an encapsulant.

Japanese Patent Publication No. 11-074424 to Yutaka et al. discusses a method for making an encapsulant for use in a photo semiconductor device. In this method, a silica powder containing PbO or $TiO_2$ having a particle size ranging between 3 µm and 60 µm is used as an index-matched filler for an epoxy resin composition. PbO or $TiO_2$ can cause crystallization during manufacturing of these multi-component glass fillers, thereby decreasing the transmittance of the filled epoxy. In addition to the aforementioned disadvantages of using $TiO_2$ as a filler material, PbO is known to be a health hazard, and its use in manufacturing of the encapsulants should therefore be avoided.

U.S. Pat. No. 6,246,123 to Landers et al. describes an encapsulant having high transmittance, low CTE, and low $T_g$. The encapsulant is made from a polymer resin and an index-matched filler. However, the filler is selected from a group consisting of alkali zinc borosilicate glasses. The presence of alkali ions is know to potentially reduce electrical resistivity of encapsulants, leading to high leakage currents and possible damage to the encapsulated device. For example, U.S. Pat. No. 4,358,552 to Shinohara et al. explains that encapsulants incorporating low levels of alkali contaminants, such as $Li^+$, $Na^+$, $K^+$, and ionic contaminants, such as Cl, improves electrical insulation of the encapsulated electronic device.

Naganuma et al. in Journal of Material Science Letters, vol. 18, pp. 1587-1589, (1999) describes preparation of encapsulants for opto-electronic devices by mixing an epoxy with a filler prepared from a multicomponent glass, $SiO_2$—$Al_2O_3$—$B_2O_3$—MgO—CaO having an average particle size of 26 µm or 85 µm. During the described curing of the epoxy and the filler mixture, the mold is turned over every 10 minutes to prevent segregation of the filler. However, these encapsulants do not have transmittance higher than 65% at a CTE lower than 50 ppm/° C., and therefore are not suitable for use in the manufacture of opto-electronic devices.

It should be appreciated from the foregoing description that there remains a need for a transparent encapsulant having uniform and low CTE over its entire volume comprising inexpensive index-matched fillers and epoxy resins. The fillers should be able to be uniformly dispersed to provide an average CTE lower than 50 ppm/° C., with a CTE variation of less than ±30% over the entire volume of the encapsulant to prevent thermal expansion damage. The encapsulant also should have a transmittance higher than 65% to minimize signal losses, and $T_g$ higher than 120° C. to reduce physical stress and breakage, thereby preventing the opto-electronic device from damage. Finally, the encapsulant should exhibit high electrical resistivity under varying temperature and humidity conditions. The present invention fulfills this need and provides further advantages.

SUMMARY OF THE INVENTION

The present invention resides in an encapsulant for an opto-electronic device or optical component, the encapsulant characterized by a coefficient of thermal expansion and an optical transmittance. The encapsulant incorporates a filler consisting essentially of glass particles having diameters in the range of 1 μm to 500 μm formed from a glass essentially free of titania. The glass is characterized by a glass refractive index having a value in the range of 1.48 to 1.60 and a variance of less than about 0.001. The filler is characterized by a filler refractive index. The encapsulant also incorporates an epoxy characterized by an epoxy refractive index. The coefficient of thermal expansion of the encapsulant has an average value of less than 50 ppm/° C., and more preferably less than 40 ppm/° C. The filler and epoxy refractive indices have values sufficiently similar such that the optical transmittance of the encapsulant is at least 65% when measured at a wavelength in the range of 300 nm to 800 nm at an encapsulant thickness of about 1 mm.

In preferred embodiments of the present invention, the coefficient of thermal expansion of the encapsulant preferably has a variation of less than ±30%, and more preferably less than ±10%. The optical transmittance of the encapsulant preferably is at least 75%, more preferably 80%, when measured at a wavelength in the range of 300 nm to 800 nm at an encapsulant thickness of about 1 mm. The optical transmittance of the encapsulant is at least 65%, more preferably 75%, and most preferably 80%, when measured at a wavelength in the range of 600 nm to 700 nm at an encapsulant thickness of about 1 mm. The optical transmittance of the encapsulant preferably is at least 65%, more preferably 75%, and most preferably 80%, when measured at a wavelength of about 650 nm at an encapsulant thickness of about 1 mm.

The glass particles in the encapsulant preferably are essentially free of alkali, most preferably consisting essentially of borosilicate. An embodiment of the present invention is an opto-electronic device substantially encased in such an encapsulant. Preferably, the glass refractive index has a value of about 1.526. The glass particles have diameters in the range of 1 μm to 250 μm, and more preferably 10 μm to 250 μm. Preferably, less than 60 volume percent of the filler incorporates glass particles having diameters smaller than 10 μm, more preferably less than 20 volume percent, most preferably less than 10 volume percent.

In preferred embodiments of the encapsulant, the filler comprises between 5 volume percent and 60 volume percent of the total volume of encapsulant, more preferably 10 volume percent and 50 volume percent, and most preferably between 15 volume percent and 40 volume percent. Preferably, the filler has been heat treated at a heat treatment temperature for at least about 1 hour, more preferably between 5 hours and 50 hours, and most preferably between 30 hours and 40 hours. The heat treatment temperature is at about the strain point of the glass or less, and more preferably between 20° C. and the strain point of the glass. Preferred encapsulants have been heat treated at a heat treatment temperature of about 627° C. or less, more preferably between 20° C. and 627° C., and most preferably between 450° C. and 550° C. This heat treatment preferably takes place in an oxygen-containing atmosphere, preferably dry air.

In preferred embodiments of the invention, the filler is reacted with a silane coupling agent selected from the group consisting of aminopropyl-triethoxysilane, vinyltrimethoxysilane, methacryloxy propyltriethoxysilane, gylcidoxypropyltrimethoxysilane, and mixtures of these. Most preferred is amino-propyltriethoxysilane.

The epoxy is prepared from a composition incorporating: a) diglycidyl ether of bisphenol-A resin; b) cyclo-aliphatic epoxy resin; c) a hardener; and d) an accelerator. The ratio by weight of diglycidyl ether of bisphenol-A resin to combined weight of diglycidyl ether of bisphenol-A resin and cyclo-aliphatic epoxy resin preferably has a value in the range of 0.20 to 0.54, and more preferably 0.30 to 0.50. The ratio by weight of hardener to combined weight of diglycidyl ether of bisphenol-A resin and cyclo-aliphatic epoxy resin has a value in the range of 0.30 to 0.80, and more preferably 0.50 to 0.70. The ratio by weight of accelerator to combined weight of diglycidyl ether of bisphenol-A resin and cyclo-aliphatic epoxy resin preferably has a value in the range of 0.001 and 0.05, and more preferably 0.005 and 0.03.

A preferred embodiment of the present invention is an encapsulant for an opto-electronic device or optical component, the encapsulant characterized by a coefficient of thermal expansion and an optical transmittance, the encapsulant incorporating: between 15 volume percent and 40 volume percent of a filler and 2) between 60 volume percent and 85 volume percent of an epoxy. The filler consists essentially of glass particles formed from an alkali-free borosilicate glass that has been silylated with amino-propyltriethoxysilane, with the particles having diameters in the range of 1 μm to 250 μm. Less than 10 percent by volume of the particles have diameters less than 10 μm, and the glass is characterized by a glass refractive index having a value of about 1.526 and a variance of less than about 0.001. The filler has been heated in an oxygen-containing atmosphere at a temperature in the range of 450° C. to 550° C. for a duration in the range of 30 hours to 40 hours. The epoxy is prepared from a composition incorporating diglycidyl ether of bisphenol-A resin, cyclo-aliphatic epoxy resin, a hardener, and an accelerator. The ratio by weight of diglycidyl ether of bisphenol-A resin to combined weight of diglycidyl ether of bisphenol-A resin and cyclo-aliphatic epoxy resin has a value in the range of 0.30 to 0.50, the-ratio by weight of hardener to combined weight of diglycidyl ether of bisphenol-A resin and cyclo-aliphatic epoxy resin has a value in the range of 0.50 to 0.70, and the ratio by weight of accelerator to combined weight of diglycidyl ether of bisphenol-A resin and cyclo-aliphatic epoxy resin has a value in the range of 0.005 and 0.03. The coefficient of thermal expansion of the encapsulant has an average value of less than about 40 ppm/° C. and a variation of less than about ±10%, and the optical transmittance of the encapsulant is at least 80% when measured at a wavelength of 650 nm at an encapsulant thickness of 1 mm.

The present invention also resides in method for an encapsulant for an opto-electronic device or optical component incorporating the following steps: 1) processing a glass characterized by a glass refractive index in the range of 1.48 to 1.60 with a variance of less than about 0.001 to form filler particles from the glass having diameters between 1 μm and 500 μm and characterized by a filler refractive index; 2) heating the filler particles in an oxygen-containing atmosphere; 3) preparing an epoxy characterized by an epoxy refractive index, so that the filler and epoxy refractive indices are sufficiently similar such the encapsulant has optical transmittance of at least 65% when measured at a wavelength in the range of 300 nm to 800 nm at an encapsulant thickness of about 1 mm; 4) heating the epoxy to a predetermined temperature for a predetermined duration sufficient to increase the viscosity of the epoxy to a level such that the epoxy is characterized by a settling velocity equal to or greater than a predetermined value; 5) mixing the epoxy with the filler particles within a predetermined mixing duration to form the encapsulant; 6) cooling the encapsulant to a predetermined temperature sufficient to increase the viscosity of the epoxy in the encapsulant within a predetermined cooling duration; and 7) removing air bubbles from the encapsulant within a predetermined defoaming duration.

Preferred aspects of the method incorporate processing the glass to form filler particles having diameters between 1 µm and 250 µm, such that less than 60 percent by volume, more preferably 20 percent, and most preferably 10 percent, of the filler particles have diameters less than 10 µm. Preferably, the method incorporates processing the glass to form filler particles having diameters between 10 µm and 250 µm. The method preferably incorporates heating the filler particles comprises heating the filler particles to the temperatures and for the durations discussed above, preferably in dry air. The method also preferably incorporates reacting the glass particles with a silane coupling agent after the step of processing the glass, such as amninopropyltriethoxysilane.

The step of preparing an epoxy preferably incorporates mixing together a diglycidyl ether of bisphenol-A resin, a cyclo-aliphatic resin, a hardener, and an accelerator. Preferably to prepare an epoxy to have a sufficient viscosity, such that the settling velocity of the filler particles in the encapsulant is less than about 11 mm/min, more preferably 6 mm/min, most preferably 4 mm/min. The method can further incorporate heating the epoxy to a temperature between 80° C. and 140° C., more preferably between 90° C. and 110° C., most preferably about 100° C. for a predetermined duration sufficient to increase the viscosity of the epoxy before the step of mixing the epoxy with the filler particles.

In preferred aspects of the invention, the step of heating the epoxy incorporates heating the epoxy for a duration sufficient to increase the viscosity of the epoxy to be in the range of 300 cP to 40,000 cP, more preferably 500 cP to 20,000 cP, and most preferably 750 cP to 10,000 cP. The step of cooling the encapsulant preferably incorporates cooling the encapsulant to a temperature sufficient to increases the viscosity of the epoxy to a value in the range of 1,000 cP to 40,000 cP, more preferably 5,000 cP to 20,000 cP, and most preferably 7,000 cP to 12,000 cP. Preferably, the steps of mixing, cooling, and removing air bubbles have a combined duration of less than about 120 minutes, more preferably 60 minutes, and most preferably 30 minutes.

A particularly preferred method for making an encapsulant for an opto-electronic device or optical component within the scope of the present invention incorporates the following steps: 1) processing a borosilicate glass characterized by a refractive index having a value of about 1.526 when measured at a wavelength of about 588 nm and a variance of less than about 0.001, to form borosilicate glass particles having diameters between 1 µm and 250 µm, such that less than 60 percent by volume of the borosilicate glass particles have diameters less than 10 µm; 2) heating the borosilicate glass particles to a temperature between 450° C. and 550° C. for a duration between 30 hours and 40 hours in an oxygen-containing atmosphere; 3) reacting the borosilicate glass particles with aminopropyltriethoxysilane; 4) preparing an epoxy by mixing diglycidyl ether of bisphenol-A resin, cyclo-aliphatic resin, hexahydrophthalic anhydride curing agent, and triphenylphosphite catalyst; 5) heating the epoxy to about 100° C. for a duration sufficient to increase the viscosity of the epoxy to between 750 cP and 10,000 cP to obtain a settling velocity of the borosilicate glass particles in the epoxy to less than 4 mm/min; 6) mixing the epoxy and the borosilicate glass particles; 7) cooling the encapsulant to a temperature sufficient to further increase the viscosity of the liquid epoxy to a level between 7,000 cP and 12,000 cP; and 8) removing air bubbles from the encapsulant. The steps, of mixing, cooling, and removing in this preferred method have a combined duration of less than about 30 minutes.

BRIEF DESCRIPTION OF THE DRAWINGS

FIG. 1 is a graphical representation of the relation between the reaction time, the reaction temperature, and the viscosity of three liquid epoxies after addition of catalyst. The epoxies were prepared in the same manner as described in EXAMPLE 1, except that they were reacted at about 90° C. for about 255 minutes, at about 100° C. for about 182 minutes, and at about 110° C. for about 103.5 minutes, respectively.

FIG. 2 is a graphical representation of the relation between the cooling temperature and the viscosity of a liquid epoxy prepared in the same manner as described in EXAMPLE 1, reacted at 100° C. for about 120 minutes after addition of the catalyst.

FIG. 3 is a schematic representation of the method for preparation of the borosilicate glass filler as described in EXAMPLE 1.

FIG. 4 is a graphical representation of the size distribution of filler particles prepared within the scope of the present invention, after the step of ball milling.

FIG. 5 is a graphical representation of the size distribution of filler particles prepared within the scope of the present invention, after the steps of sieving and solvent washing.

FIG. 6 is a schematic representation of the method for preparation of the epoxy as described in EXAMPLE 1.

FIG. 7 is a schematic representation of the method for preparation of the encapsulant as described in EXAMPLE 1.

FIG. 8 is a graphical representation of the size distribution of filler particles prepared within the scope of the present invention, obtained by filtering the solvent used for washing in the step of solvent washing.

DETAILED DESCRIPTION OF THE PREFERRED EMBODIMENT

The present invention resides in a highly transparent encapsulant for use with opto-electronic devices incorporating a glass filler and an epoxy, and an opto-electronic device substantially encased in the encapsulant. The encapsulant is suitable for use with opto-electronic devices, such as LEDs, photodetectors, and fiber optic devices and optical components such as lenses, prisms, and mirror substrates. The filler is made from commercial glass particles having predetermined particle size that are heat treated under predetermined conditions to improve the optical properties of the filler. The epoxy is prepared from conventional materials in weight ratios selected such that the resulting encapsulant is highly transparent, because the refractive index of the epoxy closely matches the refractive index of the filler. The encapsulant of the present invention offers a unique combination of low and uniform CTE and high transparency, along with high electrical resistivity. The present invention also resides in a method for making this encapsulant.

The filler is prepared by crushing and grinding a $TiO_2$— free commercial glass. The refractive index of this glass can range between 1.48 and 1.60, as measured at a wavelength of about 588 nm and a temperature of about 25° C. To be suitable for use as a filler in the encapsulant of the present invention, this glass must have a substantially homogeneous refractive index. Excessive variation in the refractive index of the filler, which would result if the glass used to make the filler had excessive variation in its refractive index, would make it impossible to prepare a filler that closely and consistently matches the refractive index of the epoxy. Preferably, the refractive index variation of the glass should be less than 0.001. High electrical resistivity can be achieved using glasses substantially free of alkali ions or other electrically conductive ions. The preferred filler used in the encapsulant of the present invention is made from a commercially available alkali-free borosilicate glass having a typical composition by weight of 10% to 50% $SiO_2$, 10% to 50% BaO, 10% to 20% $Al_2O_3$, and 10% to 20% $B_2O_3$. An example of a commercially-available alkali-free borosilicate glass suitable for use in the present invention is marketed under the trade name AF45 from Schott Corporation of Yonkers, New York. Other $TiO_2$—free glasses containing alkali ions, such as soda lime glasses, can be used for preparation of filler particles for encapsulants for electronic devices that can tolerate low electrical resistivity, or for optical components, such as lenses, for which no requirements for electrical insulation exist.

To prepare the filler, the alkali-free and titania-free glass first is crushed into coarse, irregular particles approximately 5 mm or less in size. These coarse particles then are ball-milled into finer particles using conventional methods. These finer particles are first screened and then solvent-washed. The particles are finally dried and taken for use as the filler material. These particles have sizes preferably between 1 μm and 500 μm, more preferably between 1 μm and 250 μm, and most preferably between 10 μm and 250 μm. The filler particles thereby obtained then are heat-treated, at temperatures preferably lower than the strain point of the glass. The borosilicate fillers are heat treated preferably below the strain point of the borosilicate glass, about 627° C., more preferably between 20° C. and 627° C., and most preferably between 450° C. and 550° C. The heat treatment is carried out for a duration of at least 1 hour, more preferably between 5 hours and 50 hours, and most preferably between 30 hours and 40 hours. To provide for improved optical properties in the filler material, this heat treatment preferably takes place in an oxygen-containing atmosphere, most preferably in dry air composed of about 21% O2 and about 79% N2 with a moisture content less than 60 ppm. After the heat treatment, the filler is mixed into an epoxy prepared as described below.

Optionally, the miscibility and bonding of the filler particles with the epoxy can be increased by using a suitable silane coupling agent. As is well known in the art, for example, in Silane Coupling Agents by Edwin P. Pluedemann (Plenum Press, New York, 1991), these agents aid in chemical bonding of an organic resin, such as epoxy, with an inorganic material, such as glass. This bonding can prevent formation of voids at the glass and resin interface by increasing miscibility and thereby transmittance. This bonding also can increase moisture resistance and mechanical strength of the encapsulant. Examples of such agents are amino-propyltriethoxysilane, vinyltrimethoxysilane, methacryloxy propyltriethoxysilane, and gylcidoxypropyltrimethoxysilane. Aminopropyltriethoxysilane is most preferred of these. These agents can be mixed with components of the encapsulant at different stages of its preparation. For example, these agents can be reacted with filler particles prior to their mixing with the epoxy, or they can be mixed with the epoxy before mixing the epoxy with the filler. In the most preferred process, the filler particles are first reacted with aminopropyltriethoxysilane in a mixer, then heat treated at about 100° C. for about 1 hour, and finally dispersed in the epoxy.

The epoxy is made from a composition incorporating the following four components, generally known for manufacture of these epoxies, designated as (a) to (d) below.

(a) Diglycidyl ether of bisphenol-A (DGEBPA) resins, such as EPON 825 or EPON 3002 marketed by Shell Chemical Company of Houston, Tex.

(b) Cyclo-aliphatic epoxy resin, such as CY 179 MA marketed by Ciba Specialty Chemicals, Tarrytown, N.Y., or ERL-4221E marketed by Dow Chemical Company, Midland, Mich.

(c) A hardener (curing agent), such as hexahydrophthalic anhydride (HHPA) marketed by Lonza Chemicals, Basel, Switzerland; and (d) An accelerator (catalyst), such as triphenylphosphite (TPPP) marketed by GE Specialty Chemicals, Morgantown, W.Va., or zinc stearate marketed by Crompton Corporation, Greenwich, Conn.

Components (a) to (d) listed above have different refractive indices. They are combined in specific proportions to provide an epoxy having a refractive index closely matching to that of the filler described above. As a practical matter, it is not possible to directly measure the refractive index of the filler particles with sufficient precision, and this index may not be identical to that of the glass from which the filler is prepared. Therefore, the proportions of components (a) to (d) are determined experimentally, so that the resulting encapsulant provides for acceptable, and preferably maximum, light transmittance when the particular epoxy is used with a particular filler. To prepare suitable epoxies for use with the present invention, the following three ratios R (for resin), H (for hardener), and A (for accelerator) are defined for the amounts by weight of components (a), (b), (c), and (d) to be used in the epoxy:

$$R=a/(a+b)$$

$$H=c/(a+b)$$

$$A=d/(a+b)$$

To provide epoxies having refractive indices sufficiently similar to that of fillers produced as described above resulting in acceptable transmittance, preferably R ranges between 0.20 and 0.54, H ranges between 0.3 and 0.8, and A ranges between 0.001 and 0.05. Most preferably, R ranges between 0.3 and 0.5, H ranges between 0.5 and 0.7, and A ranges between 0.005 and 0.03.

Mixing of the filler and the liquid epoxy under the considerations discussed above produces the encapsulants of the present invention. The liquid encapsulant can then be placed over a suitable opto-electronic device using various methods known in the art, such as dip-coating, potting, casting, and transfer molding. Eventual solidification and posturing of this liquid encapsulant yields an opto-electronic device encased in the encapsulants of the present invention.

After mixing of the filler with the liquid epoxy and before the solidification of this suspension, the filler particles may settle down at the bottom of the liquid due to gravity. This settling causes non-uniform distribution of the filler particles in the encapsulant, which results in, non-uniform CTE and can eventually damage the encapsulated device during use. This settling can be partially or completely prevented by slowing down the settling velocity of the particles in a liquid epoxy. The settling velocity of solid particles in a liquid can be calculated from Stokes' law, $$u_t = \frac{D_p^2 g (P_p - P)}{18\mu}$$

where, $u_t$ is the settling velocity, $D_P$ is the characteristic diameter of the filler particle, g is the gravitational constant, $P_P$ is the density of the filler particle, P is the density of the liquid encapsulant, and $\mu$ is the viscosity of the liquid encapsulant. Table 1 below provides the settling velocities in units of mm/min of the borosilicate particles in the liquid epoxy mixture described below in EXAMPLE 1. In EXAMPLE 1, the borosilicate glass has a density of 2.72 g/cm³, and the epoxy has a density of 1.32 g/cm³. The settling velocities in Table 1 are calculated for particle sizes varying between 1 μm and 500 μm, and for viscosity of the liquid epoxy varying between 100 cP and 20,000 cP.

TABLE 1

| Liquid epoxy Viscosity, cP | Borosilicate Filler Particle Size, μm | | | | | |
|---|---|---|---|---|---|---|
| | 1 | 20 | 50 | 100 | 250 | 500 |
| 100 | 0.0005 | 0.183 | 1.145 | 4.578 | 28.613 | 114.450 |
| 250 | 0.0002 | 0.073 | 0.458 | 1.831 | 11.445 | 45.780 |
| 500 | 0.0001 | 0.037 | 0.229 | 0.916 | 5.723 | 22.890 |
| 750 | 0.0001 | 0.024 | 0.153 | 0.610 | 3.815 | 15.260 |
| 1,000 | 0.0000 | 0.018 | 0.114 | 0.458 | 2.861 | 11.445 |
| 2,000 | 0.0000 | 0.009 | 0.057 | 0.229 | 1.431 | 5.723 |
| 3,000 | 0.0000 | 0.006 | 0.038 | 0.153 | 0.954 | 3.815 |
| 4,000 | 0.0000 | 0.005 | 0.029 | 0.114 | 0.715 | 2.861 |
| 5,000 | 0.0000 | 0.004 | 0.023 | 0.092 | 0.572 | 2.289 |
| 10,000 | 0.0000 | 0.002 | 0.011 | 0.046 | 0.286 | 1.145 |
| 20,000 | 0.0000 | 0.001 | 0.006 | 0.023 | 0.143 | 0.572 |

To achieve uniform dispersion of the filler particles in the solid encapsulant, the settling velocities preferably should be less than 11 mm/min, more preferably less than 6 mm/min, and most preferably less than 4 mm/min. For example, according to Table 1, such settling velocities can be achieved by using borosilicate particles having sizes preferably less than 500 μm, and most preferably less than 250 μm, and liquid epoxy viscosities preferably higher than 300 cP, more preferably higher than 500 cP, and most preferably higher than 750 cP.

Use of very small filler particles also should be avoided to prevent particle agglomerations or bubble entrapments that can cause non-uniform particle dispersion or low transmittance. Therefore, particle sizes preferably should be larger than 1 μm, and most preferably larger than 10 μm.

Very high liquid epoxy viscosities should be avoided to easily mix the filler particles with the liquid epoxy, and to easily defoam the resulting suspension. During the mixing, air bubbles can be entrapped in the encapsulant. These bubbles should be removed from the liquid to increase transmittance. This is achieved using various methods known in the art, such as defoaming in vacuum and bubbling with helium. Therefore, the epoxy viscosities preferably should be lower than about 40,000 cP, more preferably lower than about 20,000 cP, and most preferably lower than about 10,000 cP for easy mixing of the epoxy with the filler and to defoam the suspension.

Thus, to obtain uniform dispersion of the filler in the encapsulant, to prevent entrapment of air bubbles, and to achieve uniform encapsulant CTEs having variations preferably below about ±30%, and most preferably below about ±10%, the filler particle sizes preferably should be between 1 μm and 500 μm, more preferably between 1 μm and 250 μm, and most preferably between 10 μm and 250 μm; and the liquid epoxy viscosities preferably should be between 300 cP and 40,000 cP, more preferably between 500 cP and 20,000 cP, and most preferably between 750 cP and 10,000 cP.

The liquid epoxies having viscosities preferred for use in the encapsulants of the present invention are obtained by reacting the liquid epoxy after addition of the catalyst at a temperature in the range of preferably 80° C. to 140° C., more preferably 90° C. to 110° C., and most preferably about 100° C., for a predetermined period. As an example, FIG. 1 shows the relationship between reaction time, reaction temperature, and the liquid epoxy viscosity. In this example, the reaction times in minutes required to attain the preferred liquid epoxy before addition of the filler particles, are shown in Table 2.

TABLE 2

| Reaction Temperature | Liquid Epoxy Viscocity | | |
|---|---|---|---|
| | 300 cP | 500 cP | 750 cP |
| 90° C. | 65 | 100 | 128 |
| 100° C. | 65 | 85 | 108 |
| 110° C. | 51 | 60 | 68 |

Before mixing, the glass filler is heated to a temperature preferably between 20° C. and the reaction temperature of the liquid epoxy, more preferably between 50° C. and the reaction temperature of the epoxy, and most preferably between 60° C. and the reaction temperature of the liquid epoxy. After mixing, the liquid suspension is cooled to a predetermined temperature, to further increase the viscosity of the liquid epoxy and thereby prevent the settling of the filler particles. As an example of this, the relationship between the cooling temperature and the viscosity of the liquid epoxy is illustrated in FIG. 2. The cooling temperature is predetermined according to the viscosity of the liquid epoxy. Cooling temperatures that yield viscosities preferably between 1,000 cP and 40,000 cP, more preferably between 5,000 cP and 20,000 cP, and most preferably between 7,000 and 12,000 cP are within the scope of this invention. The suspension then is defoamed at this predetermined cooling temperature. The suspension is preferably stirred during the cooling and the defoaming to prevent the settling of the filler particles.

The cooling and defoaming of the suspension should be completed preferably within about 120 minutes, more preferably within about 60 minutes, and most preferably within about 30 minutes, to prevent the settling of the filler particles in the liquid epoxy.

After completion of defoaming, the liquid encapsulant is placed on the surfaces of suitable opto-electronic devices using various methods known in the art, such as dip-coating, potting, casting, and transfer molding. Eventual solidification of the liquid suspension and a step of posturing yield the encapsulated opto-electronic device.

By matching the refractive index of the epoxy to that of the filler, an encapsulating material with high transmittance is obtained. This transmittance is preferably higher than about 65%, more preferably higher than about 75% and most preferably higher than about 80%, preferably at a wavelength range of 300 nm and 800 nm, more preferably at a wavelength range of 600 nm and 700 nm, and most preferably at 650 nm, when measured across an about 1 mm thick sample of encapsulant. Most examples of preferred encapsulants made within the scope of the present invention exhibit transmittances higher than about 85%.

Because the filler and the epoxy are prepared to have closely matched refractive indexes, the relative amount of the filler material in the encapsulant can be varied substantially without having significant effect on the light transmittance of the encapsulant. Therefore, the relative amount of filler can be varied to adjust the CTE of the resulting encapsulant to preferably less than about 50 ppm/C and most preferably less than about 40 ppm/C. The relative amount of filler in the encapsulant preferably ranges between 5 volume percent and 60 volume percent of the encapsulant, more preferably between 10 volume percent and 50 volume percent, and most preferably between 15 volume percent and 40 volume percent.

In addition to the advantages described above, the most preferred encapsulants, which incorporate alkali-free borosilicate glass in the filler, have a high electrical resistivity, in contrast to other possible glasses. Encapsulants produced according to the method have a high tolerance for humid environments (i.e., up to 85% relative humidity at a temperature of 85 C), which results in stable optical and physical properties under a variety of environmental conditions.

Because of their low CTE and high transmittance, encapsulants within the scope of the present invention also can be used in the manufacturing of optical components such as lenses, prisms, mirror substrates, and similar products. When not used with an electronic device or in an application for which electrical insulation properties are not important, such encapsulants also can incorporate high-alkali glasses as fillers.

EXAMPLE 1

An encapsulant within the scope of the present invention is prepared in this illustrative Example.

Preparation of the Filler Particles:

The process of preparation of the filler particles is schematically illustrated in FIG. 3. A commercial alkali-free borosilicate glass sheet, marketed under the trade name AF45 by Schott Corporation, having an average refractive index of about 1.526 at about 588 nm and at about 25° C., and a refractive index variation within the glass of less than about 0.001, was crushed into coarse particles, and then sieved through a #8 mesh sieve to eliminate all particles larger than about 2.36 mm in diameter. These sieved particles were placed in a 100 ml zirconia milling jar, along with 3 milling balls having diameters of 20 mm and 15 milling balls having diameters of 15 mm. The particles then were planetary ball-milled at about 200 RPM for about 30 minutes. The size distribution of particles obtained after the step of ball-milling was determined using a particle size analyzer (model LA-900, marketed by Horiba Incorporated of Irvine, Calif.). As shown in FIG. 4, the particle sizes of the resulting white powder ranged between 1 µm and 300 µm, with a peak at about 50 µm.

Next, all of the milled particles larger than about 250 µm in diameter were removed via sieving. The content of particles smaller than about 10 µm in diameter in the filler was decreased via a solvent wash. This washed powder was dried at a temperature of about 160 C for about 12 hours. The size distribution of particles obtained after the steps of solvent washing and drying is shown in FIG. 5. The particle sizes of the resulting white powder ranged between 2 µm and 250 µm, with a peak at about 50 µm. Six volume percent of this powder was composed of particles having sizes smaller than about 10 µm. Then, the particles were heat treated at a temperature of about 500° C. for about 36 hours in dry air.

After heat treatment, the dried filler particles were silylated -with a silane coupling agent, as follows. The filler particles were first mixed with aminopropyl-triethoxysilane in a Keyence mixer. (Model No. HM-501, marketed by Keyence Corporation of Osaka, Japan) for about 2 minutes at a room temperature of about 20° C. In this preparation, about 1 gram of aminopropyltriethoxysilane was used per about 99 grams of filler. Finally, the particles were heat treated at a temperature of about 60 C for about 1 hour in air to complete the step of silylation.

Preparation of the Epoxy:

The process of preparation of the liquid epoxy is schematically illustrated in FIG. 6. This epoxy was prepared using the following ingredients: a) EPON 3002 resin; b) CY 1.79 MA resin; c) HHPA curing agent; and d) TPPP catalyst. The epoxy was prepared by combining about 43 grams of EPON 3002 and about 64.5 grams of CY 179 MA in a closed container. The container was placed in an ethylene glycol bath at a temperature of about 100 C, and the two components were mixed at about 300 RPM for about 60 minutes. Next, about 67.5 grams of HHPA were added to the solution, and the solution was stirred at about 300 RPM for about 5 minutes. Finally, about 1.08 gram of the catalyst, TPPP was added to the solution, and the solution was stirred for about 120 minutes at about 300 RPM, to form the epoxy. With respect to the previously-defined ratios, the composition of this epoxy provided for values of R of about 0.40, H of about 0.63, and A of about 0.01.

In addition to the preparation described above, three additional epoxies were prepared in the same manner. After addition of the catalyst, these epoxies were reacted at about 90° C. for about 255 minutes, at about 100 C for about 182 minutes, and at about 110° C. for 103.5 minutes respectively. The effect of the reaction time and the reaction temperature on the viscosity of these liquid epoxies is illustrated in FIG. 1. The viscosity of the epoxy was measured using a viscometer (Model No. LVDV-II+), a spindle (Model No. SC4-18), and a chamber (Model No. SC4-13RPY), all manufactured by Brookfield Engineering Labs Incorporated of Staughton, Mass. After mixing the catalyst, the liquid epoxies each were placed into the chamber of the viscometer, which had been heated to the reaction temperature. A shear rate of about 2.0 seconds$^{-1}$ was applied to measure the viscosities below about 900 cP, about 0.8 second$^{-1}$ to measure the viscosities varying in the range of 900 cP to 2,000 cP; and about 0.4 second$^{-1}$ to measure the viscosities above about 2,000 cP.

Mixing Filler and Epoxy to Produce Encapsulant:

The process of mixing the filler particles and the liquid epoxy is schematically illustrated in FIG. 7. This epoxy was reacted at about 100° C. for about 120 minutes after addition of the catalyst. The viscosity of this epoxy, measured at about 100 C was found to be about 1,020 cP at a shear rate of about 0.8 second$^{-1}$. About 30 grams of this epoxy were combined with about 20 grams of the filler. The resulting liquid suspension had a filler content of about 16 volume percent. The liquid suspension was mixed in the Keyence mixer for about 2 minutes, followed by cooling down and defoaming in vacuum in an oven at a temperature of about 80° C. for about 20 minutes. The liquid suspension was stirred during the steps of cooling and defoaming. In a separate experiment, a liquid epoxy having the same composition was reacted at about 100° C. for about 120 minutes in the chamber of the viscometer, and then cooled down from about 100° C. to a temperature of about 50° C. During this cooling, the viscosity of the epoxy was measured in the manner described above. The viscosity of the epoxy (without the filler) was about 8,750 cP at about 80° C. at a shear rate of about 0.4 second$^{-1}$. The resulting hot viscous suspension at about 80° C. was cast into sample molds which had been maintained at a room temperature of about 20° C. Finally, the encapsulant was partially post cured at a temperature of about 70° C. for about 2 hours, and then fully post cured at a temperature of about 165° C. for about 4 hours. The encapsulant thereby obtained had dimensions of about 13 mm diameter and about 14 mm length.

Three samples having a thickness of about 1 mm were cut from this encapsulant, one each from the top, middle, and bottom. The CTE of these three samples was measured using a dynamic mechanical analyzer, Model No. DMA 7e, and a 2 millimeter quartz penetration probe, both manufactured by Perkin Elmer Analytical Instruments of Shelton, Conn. The sample was heated to a temperature between 30° C. and 190° C. at a heating rate of about 3° C./min. During the measurements, a force of about 220 milliNewtons was applied to the probe. The slope of the linear line obtained by best fit to the temperature versus linear thermal expansion data at the temperature range of 30° C. to 100° C. yielded the CTE value of the encapsulant. The CTE was about 39.2 ppm/° C. in the top section of the encapsulant, about 38.7 ppm/° C. in the middle section, and about 38.4 ppm/° C. in the bottom section. The average CTE value for this encapsulant was about 38.8 ppm/° C., with a CTE variation of less than about ±1% over its entire volume. This CTE measurement confirmed that the filler particles were generally uniformly dispersed in the encapsulant. The same dynamic mechanical analyzer measurement was used to determine that the $T_g$ of the encapsulant sample was about 164° C. The transmittance of the fully post cured sample was measured at a room temperature of about 20° C. using a visible light spectrometer (Cary 500 Scan, marketed by Varian Inc. of Mulgrave, Victoria, Australia). A sample of the encapsulant having a thickness of about 1 millimeter had a transmittance of about 85% when measured at a wavelength of about 650 nm, and about 72% when measured at a wavelength of about 450 nm.

COMPARATIVE EXAMPLE 1

Low Viscosity

An encapsulant was prepared and analyzed in the same manner as in EXAMPLE 1, except that after the addition of TPPP, the solution was stirred for about 25 minutes at about 100 C, instead of about 120 minutes. The viscosity of the resulting epoxy was about 151 Cp at a shear rate of about 2.0 seconds$^{-1}$ and at about 100° C. Properties of the encapsulant, the filler, and, the epoxy prepared in this comparative example, are shown in Table 3. The CTE was about 62.0 ppm/° C. in the top section of the encapsulant, about 35.0 ppm/° C. in the middle section, and about 7.5 ppm/° C. in the bottom section. The average CTE value for this encapsulant was about 34.8 ppm/° C., with a variation of about ±78% over its entire volume. The results of this example indicated that the filler particles settled down at the bottom of the epoxy before it was solidified. This epoxy had a low viscosity before it was mixed with the filler, which lead to rapid gravitational settling of the particles and non-uniform distribution of the filler particles in the encapsulant. The variation of the CTE was therefore unacceptably high for encasing of opto-electronic devices.

COMPARATIVE EXAMPLE 2

Filler Size Greater than 250 μm

An encapsulant was prepared and analyzed in the same manner as in EXAMPLE 1, except that the particles removed after the step of ball-milling and sieving in EXAMPLE 1 were used in this comparative example as a filler. This filler included particles having sizes larger than about 250 μm. Properties of the encapsulant, the filler, and, the epoxy which were prepared in this example, are shown in Table 3. The CTE was about 62.0 ppm/° C. in the top section of the encapsulant, about 37.0 ppm/° C. in the middle section, and about 15.0 ppm/° C. in the bottom section. The average CTE was about 38.5 ppm/° C., with a CTE variation of about ±61% over the entire volume of the encapsulant. This variation was caused by gravitational settling of particles larger than about 250 μm, which occurred after the filler was mixed with the epoxy. This settling lead to non-uniform dispersion of the filler particles in the encapsulant and resulted in non-uniform CTE in the encapsulant. This encapsulant was not suitable for encasing of opto-electronic devices, because it had non-uniform CTE.

COMPARATIVE EXAMPLE 3

Filler Size Between 1 μm and 100 μm

An encapsulant was prepared and analyzed in the same manner as in EXAMPLE 1, except that the filler particles remaining in the solvent used in the step of solvent washing were used as filler. These particles were recovered by filtration and drying of the solvent. As shown in FIG. 8, the size of these particles ranged between 1 μm and 100 μm, with a peak at about 10 μm as determined by the particle size analyzer. Sixty volume percent of this powder was composed of particles having sizes less than about 10 μm. Properties of the encapsulant, the filler, and, the epoxy which were prepared in this example, are shown in Table 3. The transmittance of the resulting encapsulant was about 48%. The results from this comparative example showed that the particles smaller than about 10 μm were agglomerated in the encapsulant, which lead to decrease in the transmittance.

Taken together, the results of EXAMPLE 1, COMPARATIVE EXAMPLE 2, and COMPARATIVE EXAMPLE 3 indicated that the preferred size range for the filler particles is between 1 μm and 500 μm. The more preferred size range is between 1 μm and 250 μm in diameter, and the most preferred size range is between 10 μm and 250 μm. These examples further demonstrated that the filler can contain particles having sizes less than 10 μm, with the resulting encapsulant providing acceptable CTE and transmittance properties. However, the amount of particles smaller than about 10 μm in the filler should be preferably lower than about 60 volume percent of the filler, more preferably lower than about 20 volume percent, and most preferably lower than about 10 volume percent.

COMPARATIVE EXAMPLE 4

Encapsulant Incorporating No Filler Particles

An encapsulant was prepared and analyzed in the same manner as in EXAMPLE 1, except that no filler particles were incorporated into the resulting encapsulant. Properties of the encapsulant, and the epoxy which were prepared in this example, are shown in Table 3. The transmittance of this encapsulant was about 91%. However, the average CTE was very high, about 62.0 ppm/C.

COMPARATIVE EXAMPLE 5

Lower Filler Amount

An encapsulant was prepared and analyzed in the same manner as in EXAMPLE 1, except that the filler amount in the encapsulant was about 5 volume percent, instead of about 16 volume percent. Properties of the encapsulant, the filler, and the epoxy which were prepared in this example, are shown in Table 3. The transmittance of this encapsulant was about 89.6%. The average CTE was about 55.6 ppm/C with a CTE variation of about ±1%.

EXAMPLE 2

Higher Filler Amount

An encapsulant was prepared and analyzed in the same manner as in EXAMPLE 1, except that the filler amount in the encapsulant was about 46 volume percent, instead of about 16 volume percent. Properties of the encapsulant, the filler, and the epoxy which were prepared in this example, are shown in Table 3. The transmittance of this encapsulant was about 79.2%. The average CTE was about 14.4 ppm/° C. with a CTE variation less than about ±1%.

Taken together, EXAMPLE 1 and EXAMPLE 2 demonstrated that a wide range of filler loading can be incorporated into the encapsulant while retaining high transmittance, thereby allowing adjustment of transmittance and CTE to meet varying requirements. Taken together, EXAMPLE 1, EXAMPLE 2, COMPARATIVE EXAMPLE 4, and COMPARATIVE EXAMPLE 5 demonstrated that the filler content of the encapsulants should be preferably between 5 volume percent and 60 volume percent, more preferably between 10 volume percent and 50 volume percent, and most preferably between 15 volume percent and 40 volume percent to obtain both the low CTE and the high transmittance within the scope of this invention.

EXAMPLE 3

No Heat Treatment

An encapsulant was prepared and analyzed in the same manner as in EXAMPLE 1, except that the filler was not heat treated. This filler was kept in atmospheric air at a temperature of about 20° C. for about 1 hour before it was combined with the epoxy. Properties of the encapsulant, the filler, and the epoxy which were prepared in this example, are shown in Table 3. The transmittance of this encapsulant was about 69.0%.

EXAMPLE 4

Heat Treatment at 350° C.

An encapsulant was prepared and analyzed in the same manner as in EXAMPLE 1, except that the filler was heat treated at about 350 C for about 36 hours, instead of about 500° C. for about 36 hours. Properties of the encapsulant, the filler, and the epoxy which were prepared in this example, are shown in Table 3. The transmittance of this encapsulant was about 69.0%.

COMPARATIVE EXAMPLE 6

Heat Treatment at 650° C.

An encapsulant was prepared in the same manner as in EXAMPLE 1, except that the filler particles were heat treated at a temperature of about 650° C. for about 36 hours, instead of about 500° C. for about 36 hours. This heat treatment temperature was above the strain point of this glass of about 627° C. The resulting encapsulant had reduced transmittance, of about 60.5%. This result indicated that the heat treatment temperature should be lower than the strain point of the glass.

COMPARATIVE EXAMPLE 7

Heat Treatment at 750° C.

An encapsulant was prepared in the same manner as in EXAMPLE 1, except that the filler particles were heat treated at a temperature of about 750° C. for about 36 hours, instead of about 500° C. for about 36 hours. This heat treatment temperature was above the strain point of this glass of about 627° C. and approached the glass softening temperature of about 883° C. This heat treatment caused visible aggregation of the filler particles. After some mild grinding to separate the filler particles, the encapsulant was produced as described in EXAMPLE 1. The resulting encapsulant had a very low transmittance, of about 46%. This lower transmittance was caused by formation of air pockets between the aggregated particles.

Taken together, EXAMPLE 1, EXAMPLE 3, and EXAMPLE 4 demonstrated that the transmittance of the encapsulant can be maximized by heat treatment of the filler particles. Taken together, COMPARATIVE EXAMPLE 6 and COMPARATIVE EXAMPLE 7 demonstrated that the preferred maximum heat treatment temperature for the filler particles used in the encapsulant should be less than the glass strain point of the filler. The most preferred heat treatment temperature range is between 450° C. and 550° C. to maximize the transmittance of the resulting encapsulant.

EXAMPLE 5

Decreased Value of R

An encapsulant was prepared and analyzed in the same manner as in EXAMPLE 1, except that the amounts of the components of the encapsulant were adjusted so that the value of R was about 0.35 instead of about 0.40. Properties of the encapsulant, the filler, and the epoxy prepared in this example are shown in Table 3. The reduction of R altered the refractive index of the epoxy, resulting in an encapsulant having a transmittance of about 76.5%.

EXAMPLE 6

Increased Value of R

An encapsulant was prepared and analyzed in the same manner as in EXAMPLE 1, except that the amounts of the components of the encapsulant were adjusted so that the value of R was about 0.45 instead of about 0.40. Properties of the encapsulant, the filler, and the epoxy prepared in this example are shown in Table 3. The increase of R affected the refractive index of the epoxy, resulting in an encapsulant with a transmittance of about 78.1%.

COMPARATIVE EXAMPLE 8

Increased Value of R

An encapsulant was prepared and analyzed in the same manner as in EXAMPLE 1, except that the amounts of the components of the encapsulant were adjusted so that the value of R was about 0.55 instead of about 0.40. Properties of the encapsulant, the filler, and the epoxy prepared in this example are shown in Table 3. The increase of R affected the refractive index of the epoxy, resulting in an encapsulant having a transmittance of about 64.1%.

COMPARATIVE EXAMPLE 9

Decreased Value of R

An encapsulant was prepared and analyzed in the same manner as in EXAMPLE 1, except that the amounts of the components of the encapsulant were adjusted so that the value of R was about 0.05 instead of about 0.40. Properties of the encapsulant, the filler, and the epoxy prepared in this example are shown in Table 3. The transmittance of this encapsulant was very low; specifically, at a value of about 25.0%.

COMPARATIVE EXAMPLE 10

Increased Value of R

An encapsulant was prepared and analyzed in the same manner as in EXAMPLE 1, except that the value of R was about 0.95 instead of about 0.40. Properties of the encapsulant, the filler, and the epoxy prepared in this example are shown in Table 3. The transmittance of this encapsulant was very low; specifically, at a value of about 22.0%.

Taken together, EXAMPLE 1, EXAMPLE 5, EXAMPLE 6, COMPARATIVE EXAMPLE 8, COMPARATIVE EXAMPLE 9, and COMPARATIVE EXAMPLE 10, demonstrated that R should be preferably between 0.20 and 0.54, and most preferably between 0.30 and 0.50, to obtain an encapsulant having a transmittance higher than 65%.

EXAMPLE 7

Decreased Value of H

An encapsulant was prepared and analyzed in the same manner as in EXAMPLE 1, except that the amounts of the components of the encapsulant were adjusted so that the value of H was about 0.47 instead of about 0.63. Properties of the encapsulant, the filler, and the epoxy prepared in this example are shown in Table 3. This adjustment affected the refractive index of the epoxy, resulting in an encapsulant having transmittance of about 73.8%.

EXAMPLE 8

Increased Value of H

An encapsulant was prepared and analyzed in the same manner as in EXAMPLE 1, except that the amounts of the components of the encapsulant were adjusted so that the value of H was about 0.70 instead of about 0.63. Properties of the encapsulant, the filler, and the epoxy prepared in this example are shown in Table 3. This adjustment affected the refractive index of the epoxy, resulting in an encapsulant having transmittance of about 82.2%.

COMPARATIVE EXAMPLE 11

Decreased Value of H

An encapsulant was prepared in the same manner as in EXAMPLE 1, except that the amounts of the components of the encapsulant were adjusted so that the H value was about 0.05 instead of about 0.63. Properties of the encapsulant, the filler, and the epoxy prepared in this example are shown in Table 3. In this Comparative example, the epoxy and the filler mixture did not cure into a solid encapsulant. The result of this example demonstrated that solid encapsulants cannot readily be prepared when the value of H is lower than the preferred range of the present invention.

COMPARATIVE EXAMPLE 12

Increased Value of H

An encapsulant was prepared and analyzed in the same manner as in EXAMPLE 1, except that the amounts of the components of the encapsulant were adjusted so that the H value was about 0.95 instead of about 0.63. Properties of the encapsulant, the filler, and the epoxy which were prepared in this example, are shown in Table 3. The transmittance of the resulting encapsulant was very low; specifically, about 21.8%. The result of this example showed that the transmittance of the encapsulant will not be at an optimum value if the H value is higher than the preferred range of the present invention.

Taken together EXAMPLE 1, EXAMPLE 7, EXAMPLE 8, COMPARATIVE EXAMPLE 11, and COMPARATIVE EXAMPLE 12 demonstrated that the H value should be preferably between 0.30 and 0.80 and most preferably between 0.50 and 0.70 to obtain an encapsulant having a transmittance of higher than 65%.

TABLE 3

| | Encapsulant | | | Filler | | | | | Epoxy | | | | |
|---|---|---|---|---|---|---|---|---|---|---|---|---|---|
| Examples | CTE Average ppm/° C. | Variation ±% | Transmittance % | Particle Size μm | Filler Amount Volume % | Temperature ° C. | Duration hours | Atmosphere | R 0.40 | H | A | Curing Time minutes | Viscosity cP |
| Example 1 | 38.8 | 1 | 85.0 | 1-250 | 16 | 500 | 36 | Dry air | 0.40 | 0.63 | 0.01 | 120 | 1020 |
| Comparative Example 1 | 34.8 | 78 | 85.0 | 1-250 | 16 | 500 | 36 | Dry air | 0.40 | 0.63 | 0.01 | 25 | 151 |
| Comparative Example 2 | 38.5 | 61 | 85.0 | ≧250 | 16 | 500 | 36 | Dry air | 0.40 | 0.63 | 0.01 | 120 | 1020 |

TABLE 3-continued

| | Encapsulant | | | Filler | | | | | Epoxy | | | | |
|---|---|---|---|---|---|---|---|---|---|---|---|---|---|
| Examples | CTE Average ppm/° C. | Variation ±% | Transmittance % | Particle Size μm | Filler Amount Volume % | Temperature ° C. | Duration hours | Atmosphere | R 0.40 | H | A | Curing Time minutes | Viscosity cP |
| Comparative Example 3 | 38.8 | 1 | 48.0 | 1-90 | 16 | 500 | 36 | Dry air | 0.40 | 0.63 | 0.01 | 120 | 1020 |
| Comparative Example 4 | 62.0 | 1 | 91.0 | No filler | | — | — | — | 0.40 | 0.63 | 0.01 | 120 | 1020 |
| Comparative Example 5 | 55.1 | 1 | 89.6 | 1-250 | 5 | 500 | 36 | Dry air | 0.40 | 0.63 | 0.01 | 120 | 1020 |
| Example 2 | 14.4 | 1 | 79.2 | 1-250 | 46 | 500 | 36 | Dry air | 0.40 | 0.63 | 0.01 | 120 | 1020 |
| Example 3 | 38.8 | 1 | 69.0 | 1-250 | 16 | 20 | ≧1 | — | 0.40 | 0.63 | 0.01 | 120 | 1020 |
| Example 4 | 38.8 | 1 | 69.0 | 1-250 | 16 | 350 | 36 | Dry air | 0.40 | 0.63 | 0.01 | 120 | 1020 |
| Comparative Example 6 | 38.8 | 1 | 60.5 | 1-250 | 16 | 650 | 36 | Dry air | 0.40 | 0.63 | 0.01 | 120 | 1020 |
| Comparative Example 7 | 38.8 | 1 | 46.0 | 1-250 | 16 | 750 | 36 | Dry air | 0.40 | 0.63 | 0.01 | 120 | 1020 |
| Example 5 | 38.8 | 1 | 76.5 | 1-250 | 16 | 500 | 36 | Dry air | 0.35 | 0.63 | 0.01 | 120 | — |
| Example 6 | 38.8 | 1 | 78.1 | 1-250 | 16 | 500 | 36 | Dry air | 0.45 | 0.63 | 0.01 | 120 | — |
| Comparative Example 8 | 38.8 | 1 | 64.1 | 1-250 | 16 | 500 | 36 | Dry air | 0.55 | 0.63 | 0.01 | 120 | — |
| Comparative Example 9 | 38.8 | 1 | 25.0 | 1-250 | 16 | 500 | 36 | Dry air | 0.05 | 0.63 | 0.01 | 120 | — |
| Comparative Example 10 | 38.8 | 1 | 22.0 | 1-250 | 16 | 500 | 36 | Dry air | 0.95 | 0.63 | 0.01 | 120 | — |
| Example 7 | 38.8 | 1 | 73.8 | 1-250 | 16 | 500 | 36 | Dry air | 0.40 | 0.47 | 0.01 | 120 | — |
| Example 8 | 38.8 | 1 | 82.2 | 1-250 | 16 | 500 | 36 | Dry air | 0.40 | 0.70 | 0.01 | 120 | — |
| Comparative Example 11 | Encapsulant did not cure | | | 1-250 | 16 | 500 | 36 | Dry air | 0.40 | 0.05 | 0.01 | 120 | — |
| Comparative Example 12 | 38.8 | 1 | 21.8 | 1-250 | 16 | 500 | 36 | Dry air | 0.40 | 0.95 | 0.01 | 120 | — |

EXAMPLE 9

Use of Filler Glasses Containing Alkali Ions

In this example, a number of possible glass filler materials, in addition to the borosilicate glass of the present invention, were used. The glasses used were soda lime glass, marketed under the trade name K5 by Schott Corporation, and ZnO—$TiO_2$ glass, marketed under the product number 0211 by Corning Incorporated. The borosilicate glass used in preferred aspects of the present invention is alkali-free. The alkali content of the ZnO—$TiO_2$ glass is lower than 0.3 weight percent, while the alkali content of the soda lime glass is very high, varying between 13 weight percent and 17 weight percent. Filler particles were prepared as described in EXAMPLE 1 using each of these three glasses. The epoxy composition prepared was identical to that described in EXAMPLE 1, and three encapsulants containing about 40 weight percent of each of the fillers were produced.

The transmittances of these encapsulants were tested immediately after they were post-cured, and also after holding them at a temperature of about 85° C. in a relative humidity of about 85% for about 100 hours, at which point they were tested, and. for about another 1,000 hours, at which point they were retested. Specifically, before the step of postcuring, three opto-electronic devices were encased with these encapsulants. After the step of postcuring, the leakage current of each of these devices was measured to determine the level of electrical resistivity of the encapsulants. The high leakage current suggests that the encapsulant had low electrical resistivity, or vice versa. These measurements were done by attaching the opto-electronic devices to a test fixture (model HP 16442A, manufactured by Hewlett Packard Instruments Inc.), applying approximately 10 volts of potential difference to the device, and determining the leakage current using a precision semiconductor analyzer (model HP 4156A, manufactured by Hewlett Packard Instruments Inc.).

The leakage current of the three opto-electronic devices were measured immediately after post-curing of the encapsulants, and also after holding the encased devices at a temperature of about 85° C. in a relative humidity of about 85% for about 100 hours and for about 1,000 hours. During this heat and humidity treatment of the encased devices, a potential difference of about 5.25 volts was applied to the devices. The results of the transmittance measurements and the leakage current tests are shown in Table 4.

TABLE 4

| Property | Alkali-free Borosilicate | ZnO—$TiO_2$ | Soda Lime |
|---|---|---|---|
| Alkali Content, weight percent | None | Low: <0.3% | High: 13-17% |
| Transmittance (at 650 nm): | | | |
| As post-cured | 85 | 85 | 82 |
| After 100 h | 87 | 80 | 65 |
| After 1,000 h | 87 | 78 | 25 |
| Leakage Current (pA): | | | |
| As post-cured | 23 | 28 | 30 |
| After 100 h | 23 | 450 | 2,300 |
| After 1,000 h | 23 | 1,350 | 70,000 |

As illustrated by these results, while all three filler materials produced encased devices having comparable low leakage current and high encapsulant transmittance at the post-cured stage, only the alkali-free borosilicate glass maintained these superior properties when exposed to high temperature and high humidity for extended time. It appears that use in encapsulants of fillers incorporating alkali ions such as sodium or potassium, leads to deterioration of the electrically insulating properties, as well as the transmittance, of the encapsulants after extended exposure to high humidity and high temperature environments.

This example shows that the alkali-free and the titania-free glasses are the most preferred glasses for use in encapsulants for opto-electronic devices within the scope of this invention, since they both initially provide and subsequently maintain high electrical resistivity as well as high transmittance. Other titania-free glasses, such as soda-lime glasses, also can be used as fillers of encapsulants for electronic devices that can tolerate low electrical resistivity, or as fillers of epoxies for non-electronic applications not requiring electrical insulation such as lenses.

Although the invention has been described in detail with reference only to the presently preferred encapsulants and methods of preparation, those of ordinary skill in the art will appreciate that various modifications can be made without departing from the invention. Accordingly, the invention is defined only by the following claims.

We claim:

1. A method for making an encapsulant for an opto-electronic device or optical component, comprising:
   processing a glass characterized by a glass refractive index having a value in the range of 1.48 to 1.60 with a variance of less than about 0.001 to form filler particles from the glass having diameters between 1 μm and 500 μm and characterized by a filler refractive index;
   heating the filler particles in an oxygen-containing atmosphere;
   preparing an epoxy including at least a curing agent and characterized by an epoxy refractive index, wherein the filler refractive index and the epoxy refractive index are sufficiently similar such that the encapsulant has optical transmittance of at least 65% when measured at a wavelength in the range of 300 nm to 800 nm at an encapsulant thickness of about 1 mm;
   heating the epoxy to a predetermined temperature for a predetermined duration sufficient to increase the viscosity of the epoxy to a level such that the epoxy is characterized by a settling velocity equal to or greater than a predetermined value;
   mixing the epoxy with the filler particles within a predetermined mixing duration to form the encapsulant;
   cooling the encapsulant to a predetermined temperature sufficient to increase the viscosity of the epoxy in the encapsulant within a predetermined cooling duration; and
   removing air bubbles from the encapsulant within a predetermined defoaming duration.

2. A method as defined in claim 1, wherein the step of processing a glass comprises processing the glass to form filler particles having diameters between 1 μm and 250 μm.

3. A method as defined in claim 2, wherein the step of processing a glass comprises processing the glass to form filler particles, such that less than 60 percent by volume of the filler particles have diameters less than 10 μm.

4. A method as defined in claim 3, wherein the step of processing a glass comprises processing the glass to form filler particles, such that less than 20 percent by volume of the filler particles have diameters less than 10 μm.

5. A method as defined in claim 4, wherein the step of processing a glass comprises processing the glass to form filler particles, such that less than 10 percent by volume of the filler particles have diameters less than 10 μm.

6. A method as defined in claim 5, wherein the step of processing a glass comprises processing the glass to form filler particles having diameters between 10 μm and 250 μm.

7. A method as defined in claim 1, wherein the step of heating the filler particles comprises heating the filler particles to a temperature about the strain point of the glass or less.

8. A method as defined in claim 7, wherein the step of heating the filler particles comprises heating the filler particles to a temperature between 20° C. and the strain point of the glass.

9. A method as defined in claim 7, wherein the step of heating the filler particles comprises heating the filler particles to a temperature between 20° C. and 627° C.

10. A method as defined in claim 9, wherein the step of heating the filler particles comprises heating the filler particles to a temperature between 450° C. and 550° C.

11. A method as defined in claim 7, wherein the step of heating the filler particles comprises heating the filler particles for a duration of at least about 1 hour.

12. A method as defined in claim 11, wherein the step of heating the filler particles comprises heating the filler particles for a duration of between 5 hours and 50 hours.

13. A method as defined in claim 12, wherein the step of heating the filler particles comprises heating the filler particles for a duration of between 30 hours and 40 hours.

14. A method as defined in claim 1, wherein the step of heating the filler particles comprises heating the filler particles in dry air.

15. A method as defined in claim 1, further comprising a step of reacting the glass particles with a silane coupling agent after the step of processing the glass.

16. A method as defined in claim 15, wherein the silane coupling agent is aminopropyltriethoxysilane.

17. A method as defined in claim 1, wherein the step of preparing an epoxy comprises mixing together a diglycidyl ether of bisphenol-A resin, a cyclo-aliphatic resin, a hardener, and an accelerator.

18. A method as defined in claim 1, wherein the step of preparing an epoxy comprises preparing the epoxy to have a sufficient viscosity such that the settling velocity of the filler particles in the encapsulant is less than about 11 mm/min.

19. A method as defined in claim 18, wherein the step of preparing the epoxy to have a sufficient viscosity comprises preparing the epoxy such that the settling velocity of the filler particles in the encapsulant is less than about 6 mm/min.

20. A method as defined in claim 19, wherein the step of preparing the epoxy to have a sufficient viscosity comprises preparing the epoxy such that the settling velocity of the filler particles in the encapsulant is less than about 4 mm/min.

21. A method as defined in claim 1, further comprising heating the epoxy to a temperature between 80° C. and 140° C. for a predetermined duration sufficient to increase the viscosity of the epoxy before the step of mixing the epoxy with the filler particles.

22. A method as defined in claim 21, wherein the step of heating the epoxy comprises heating the epoxy to a temperature between 90° C. and 110° C.

23. A method as defined in claim 22, wherein the step of heating the epoxy comprises heating the epoxy to a temperature of about 100° C.

24. A method as defined in claim 23, wherein the step of heating the epoxy comprises heating the epoxy for a duration sufficient to increase the viscosity of the epoxy to be in the range of 300 cP to 40,000 cP.

25. A method as defined in claim 24, wherein the step of heating the epoxy comprises heating the epoxy for a duration sufficient to increase the viscosity of the epoxy to be in the range of 500 cP to 20,000 cP.

26. A method as defined in claim 25, wherein the step of heating the epoxy comprises heating the epoxy for a duration sufficient to increase the viscosity of the epoxy to be in the range of 750 cP to 10,000 cP.

27. A method as defined in claim 1, wherein the step of cooling the encapsulant comprises cooling the encapsulant to a temperature sufficient to increase the viscosity of the epoxy to a value in the range of 1,000 cP to 40,000 cP.

28. A method as defined in claim 27, wherein the step of cooling the encapsulant comprises cooling the encapsulant to a temperature sufficient to increase the viscosity of the epoxy to a value in the range of 5,000 cP to 20,000 cP.

29. A method as defined in claim 28, wherein the step of cooling the encapsulant comprises cooling the encapsulant to a temperature sufficient to increase the viscosity of the epoxy to a value in the range of 7,000 cP to 12,000 cP.

30. A method as defined in claim 1, wherein the steps of mixing, cooling, and removing air bubbles have a combined duration of less than about 120 minutes.

31. A method as defined in claim 30, wherein the steps of mixing, cooling, and removing air bubbles have a combined duration of less than about 60 minutes.

32. A method as defined in claim 31, wherein the steps of mixing, cooling, and removing air bubbles have a combined duration of less than about 30 minutes.

33. A method for making an encapsulant for an opto-electronic device or optical component, comprising:

processing a borosilicate glass characterized by a refractive index having a value of about 1.526 when measured at a wavelength of about 588 nm and a variance of less than about 0.001, to form borosilicate glass particles having diameters between 1 μm and 250 μm, such that less than 60 percent by volume of the borosilicate glass particles have diameters less than 10 μm;

heating the borosilicate glass particles to a temperature between 450° C. and 550° C. for a duration between 30 hours and 40 hours in an oxygen-containing atmosphere;

reacting the borosilicate glass particles with aminopropyltriethoxysilane;

preparing an epoxy by mixing:
 a) diglycidyl ether of bisphenol-A resin;
 b) cyclo-aliphatic resin;
 c) hexahydrophthalic anhydride curing agent; and
 d) triphenyiphosphite catalyst;

heating the epoxy to about 100° C. for a duration sufficient to increase the viscosity of the epoxy to between 750 cP and 10,000 cP to obtain a settling velocity of the borosilicate glass particles in the epoxy of less than 4 mm/min;

mixing the epoxy and the borosilicate glass particles;

cooling the encapsulant to a temperature sufficient to further increase the viscosity of the liquid epoxy to a level between 7,000 cP and 12,000 cP; and removing air bubbles from the encapsulant;

such that the steps of mixing, cooling, and removing have a combined duration of less than about 30 minutes.

* * * * *